(12) United States Patent
Yoshimura

(10) Patent No.: US 7,502,098 B2
(45) Date of Patent: Mar. 10, 2009

(54) EXPOSURE APPARATUS

(75) Inventor: Keiji Yoshimura, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/845,650

(22) Filed: Aug. 27, 2007

(65) Prior Publication Data

US 2008/0062395 A1 Mar. 13, 2008

(30) Foreign Application Priority Data

Sep. 11, 2006 (JP) .............................. 2006-245355

(51) Int. Cl.
*G03B 27/52* (2006.01)
*G03B 27/42* (2006.01)

(52) U.S. Cl. .......................................... 355/55; 355/53

(58) Field of Classification Search ................... 355/52, 355/53, 55, 67; 250/548; 356/399–401; 430/311

See application file for complete search history.

(56) References Cited

U.S. PATENT DOCUMENTS

| | | | |
|---|---|---|---|
| 5,118,957 A * | 6/1992 | Kawashima et al. | 250/559.4 |
| 5,777,744 A * | 7/1998 | Yoshii et al. | 356/603 |
| 6,081,614 A | 6/2000 | Yamada et al. | |
| 6,327,025 B1 * | 12/2001 | Imai | 355/53 |
| 6,633,390 B2 * | 10/2003 | Shiode et al. | 356/620 |
| 7,292,311 B2 * | 11/2007 | Kurosawa | 355/53 |
| 2005/0088636 A1 | 4/2005 | Kurosawa | |

FOREIGN PATENT DOCUMENTS

JP          09-045608 A          2/1997

* cited by examiner

*Primary Examiner*—Hung Henry Nguyen
(74) *Attorney, Agent, or Firm*—Canon U.S.A., Inc. I.P. Division

(57) ABSTRACT

With respect to each of a plurality of shots on a substrate, a line or surface is calculated which approximates a plurality of positions of the surface of the substrate detected by a detector with respect to a plurality of places, and the difference between the position of the surface detected by the detector and the position of the line or surface in the direction of the optical axis of a projection optical system is calculated with respect to each of the plurality of places. With respect to each of the plurality of places, the differences are averaged over the plurality of shots to determine an offset value.

9 Claims, 6 Drawing Sheets

EXPOSURE APPARATUS

BACKGROUND OF THE INVENTION

1. Field of the Invention

The present invention relates to an exposure apparatus (scanning exposure apparatus) for exposing a substrate to light via a reticle and a projection optical system while the reticle and the substrate are moved in a scanning direction.

2. Description of the Related Art

In a scanning exposure apparatus that exposes a substrate such as a semiconductor wafer, a focus sensor is configured to only measure discrete points on the wafer surface. Therefore, in the case where there is an uneven pattern in the base of a resist, from a viewpoint of focus precision, it is preferable to measure the offset value related to the unevenness of the base pattern in advance. Japanese Patent Laid-Open No. 09-045608 proposes a method in which a wafer is exposed as the height of the wafer is adjusted based on the value obtained by subtracting the offset value from the focus measurement value (the height of the wafer surface). In Japanese Patent Laid-Open No. 09-045608, the offset value is obtained based on the measurement values of the height of the wafer surface in a plurality of sample shots.

However, if there is a singular region, for example, a region having an abnormal inclination on the wafer surface, the offset value varies depending on how the sample shots are selected. Description will be made with reference to FIG. 2. Patterns 202A to 202C are formed on a wafer substrate 201. In order to obtain an offset value corresponding to the pattern structure, the height distributions of the sample shots 202A to 202C are measured. The measurement results are simply averaged as shown by 203A to calculate an averaged height distribution (corresponding to the offset value distribution) 203B. In this example, the wafer substrate is nearly second-order-paraboloidal, and the shot 202A and the shot 202C are disposed substantially symmetrically with respect to the shot 202B. Therefore, by simply averaging the measurement results, an offset value can be obtained with comparatively high precision.

However, if dust enters between the wafer substrate and the wafer substrate stage or the wafer substrate warps in the circuit forming process, the substrate is not always second-order-paraboloidal. The situation will be described with reference to FIG. 3. In FIG. 3, since the wafer substrate 301 warps due to the processing in the pattern forming process, the wafer substrate is not paraboloidal. If the height distributions of patterns 302A to 302C formed on the substrate 301 are simply averaged as shown by 303A, the averaged height distribution inclines, for example, as shown by 303B due to the shape of the substrate. That is to say, an offset value distribution corresponding to the pattern structure cannot be calculated with high precision. As a result, the height measurement value of the substrate surface is corrected using such an offset value, and therefore the focus precision is deteriorated.

SUMMARY OF THE INVENTION

An aspect of the present invention is directed to an exposure apparatus and related method for determining an offset value with high accuracy.

In an aspect of the present invention, an exposure apparatus includes a projection optical system configured to project light from a reticle onto a substrate, and a detector configured to detect a position of a surface of the substrate in a direction of the optical axis of the projection optical system. The apparatus is configured, while the reticle and the substrate are moved in a scanning direction crossing the optical axis, to detect the position of the surface in a shot on the substrate with the detector, to subtract an offset value determined in advance from the detected position, to move the substrate in the direction of the optical axis based on the subtraction value, and to expose the substrate to light via the reticle and the projection optical system. With respect to each of a plurality of shots on the substrate, a line or surface is calculated which approximates a plurality of positions of the surface detected by the detector with respect to a plurality of places, and the difference between the position of the surface detected by the detector and the position of the line or surface in the direction of the optical axis is calculated with respect to each of the plurality of places. With respect to each of the plurality of places, the differences are averaged over the plurality of shots to determine the offset value.

In another aspect of the present invention, a method of manufacturing a device uses an exposure apparatus including a projection optical system configured to project light from a reticle onto a substrate, and a detector configured to detect a position of a surface of the substrate in a direction of the optical axis of the projection optical system. The apparatus is configured, while the reticle and the substrate are moved in a scanning direction crossing the optical axis, to detect the position of the surface in a shot on the substrate with the detector, to subtract an offset value determined in advance from the detected position, to move the substrate in the direction of the optical axis based on the subtraction value, and to expose the substrate to light via the reticle and the projection optical system. With respect to each of a plurality of shots on the substrate, a line or surface is calculated which approximates a plurality of positions of the surface detected by the detector with respect to a plurality of places, and the difference between the position of the surface detected by the detector and the position of the line or surface in the direction of the optical axis is calculated with respect to each of the plurality of places. With respect to each of the plurality of places, the differences are averaged over the plurality of shots to determine the offset value. The method includes exposing a substrate to light using the exposure apparatus, developing the exposed substrate, and processing the developed substrate to manufacture the device.

Further features and aspects of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE EMBODIMENTS

Various exemplary embodiments of the present invention will now herein be described with reference to the drawings.

The present invention is applied to a semiconductor exposure apparatus, for example. In order to remove the base pattern of the substrate (wafer) and the characteristics of the detector (focus sensor), the base pattern and the characteristics of the focus sensor are measured in advance before performing exposure. When the undulation component of the base pattern (pattern offset) is extracted, with respect to each of a plurality of shots (sample shots) on the wafer, the wafer local component is removed from the focus measurement results in a plurality of places.

In that case, a plurality of methods for removing the wafer local component can be used. From the plurality of methods for removing the wafer local component, the optimum method is automatically selected using the pattern measurement reproducibility, the range (variation in measurement values or calculation values), and so forth. The plurality of methods for removing the wafer local component include the plane approximation, the curved surface approximation, the straight-line approximation, and the curved line approximation of the surface shape of the substrate only. The methods for removing the wafer local component may be used according to the location on the wafer (for example, shot) or whether in the scanning direction or the non-scanning direction.

More specifically, the local wafer inclination component can be removed by removing the first order inclination component from the measurement results in each sample shot in consideration of the warping of the wafer. It is expected that the second order component is the largest, next to the first order component, as the wafer flatness component. In that case, the pattern offset measurement performance can be improved by removing components in consideration of the second order component.

Figure 4:
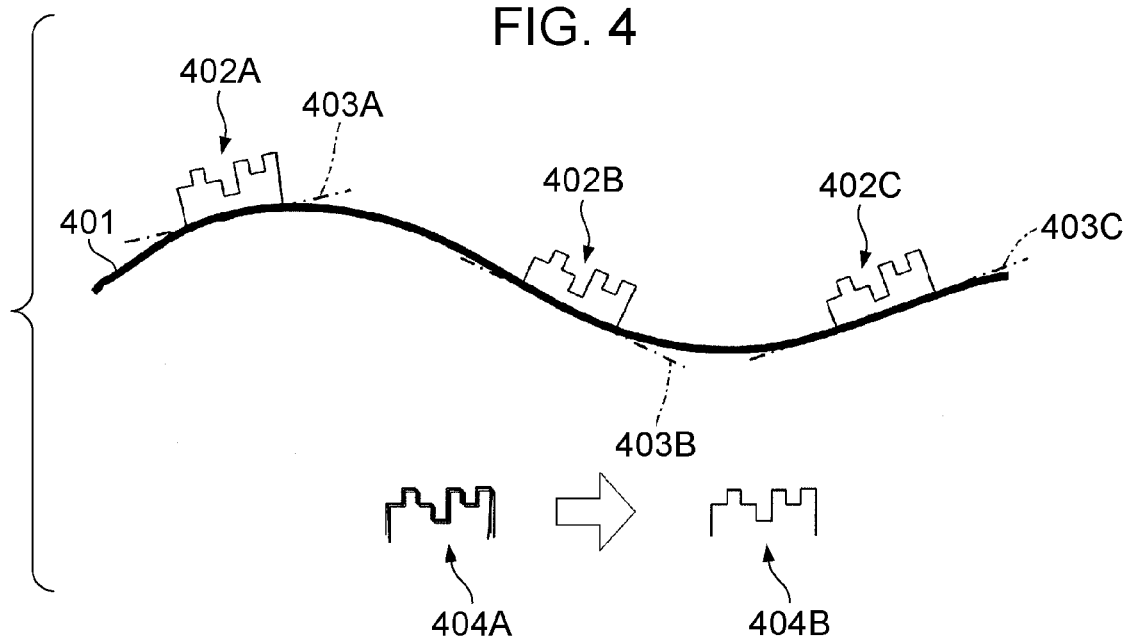
FIG. 4 illustrates a case where first order approximate surfaces are subtracted as local components of the wafer from the results of pattern unevenness measurement in a plurality of sample shots on the wafer substrate and thereafter averaging is performed.

The situation will be described with reference to FIG. 4. Since the wafer substrate 401 warps due to the processing in the pattern forming process, the wafer substrate is not bowl-shaped. From a plurality of patterns 402A to 402C formed on the substrate 401, in each sample shot, first order approximate surfaces (approximate equations of the first degree) 403A to 403C are calculated. By subtracting the first order approximate surfaces from each measured pattern value and thereafter averaging as shown by 404A, an excellent pattern can be calculated as shown by 404B.

Figure 5:
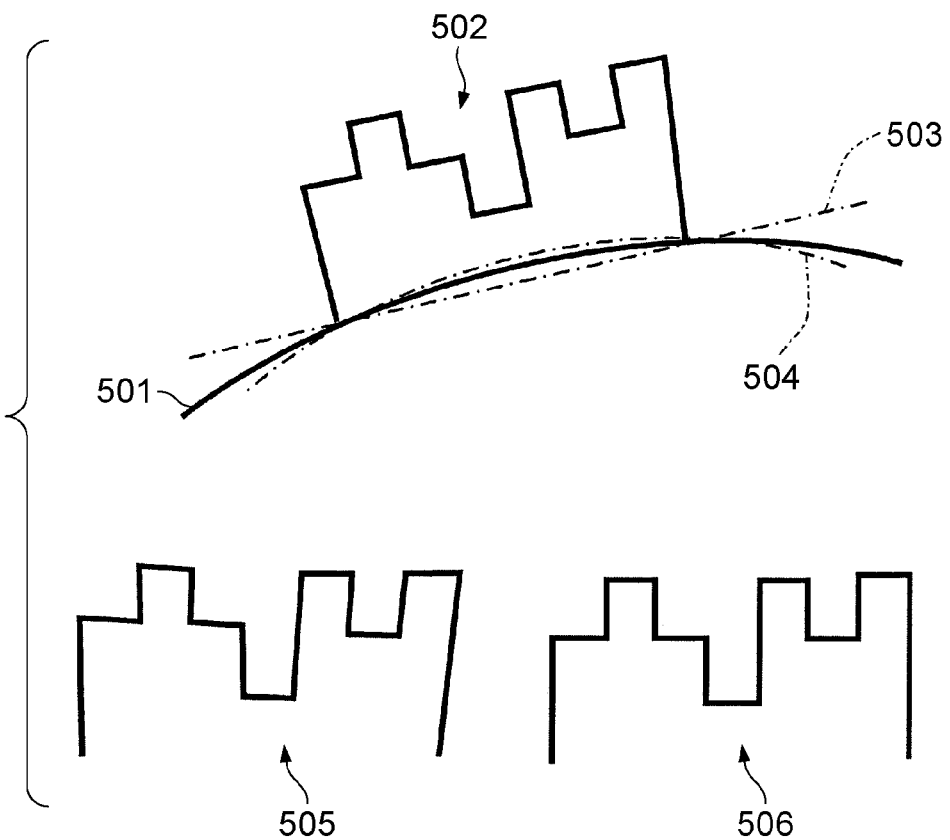
FIG. 5 illustrates a case where hyperboloids are subtracted as local components of the wafer from the results of pattern unevenness measurement in a plurality of sample shots on the wafer substrate and thereafter averaging is performed.

Alternatively, as shown in FIG. 5, instead of subtracting a first order surface in each sample shot, a hyperboloid can be subtracted. A pattern 502 is formed on the wafer substrate 501. Since the wafer substrate warps substantially in a hyperboloid, the pattern 502 formed there also bends slightly in a hyperboloid along the surface. Therefore, when the wafer substrate component 501 is removed, the pattern extraction precision of the pattern 506 using a hyperboloid 504 is higher than that of the pattern 505 using a plane 503.

[Exemplary Structure of Exposure Apparatus]

Figure 1:
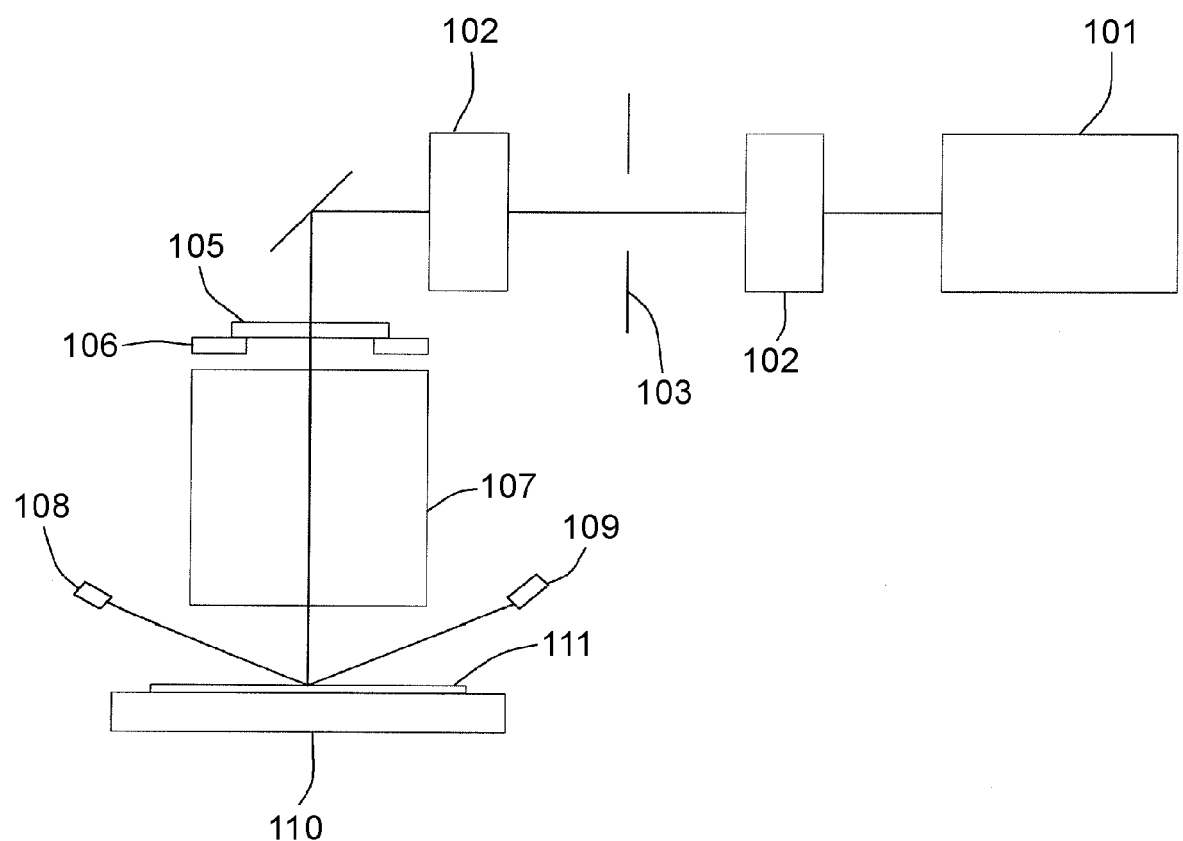
FIG. 1 schematically shows an example structure of a scanning exposure apparatus according to an embodiment of the present invention.
Figure 2:
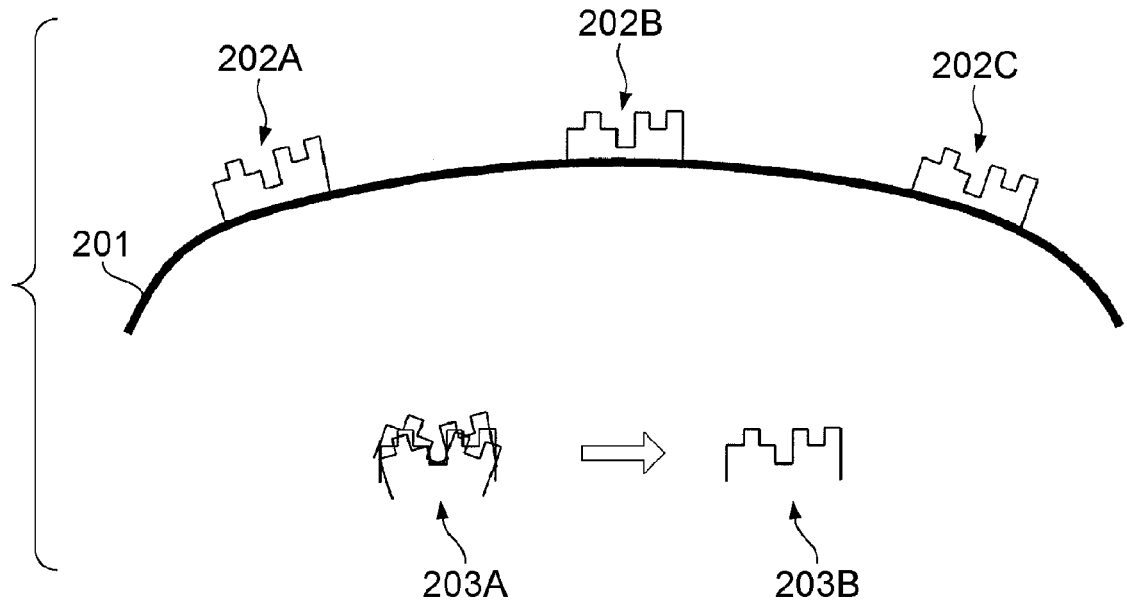
FIG. 2 illustrates the case where the results of pattern unevenness measurement in a plurality of sample shots on a bowl-shaped wafer substrate are simply averaged.
Figure 3:
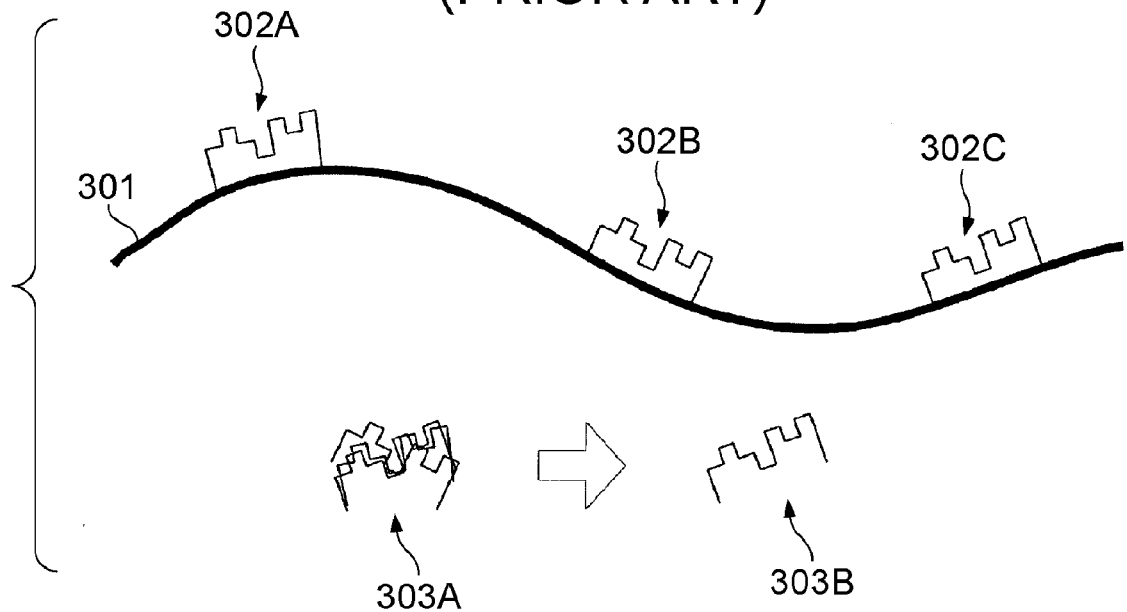
FIG. 3 illustrates the case where the results of pattern unevenness measurement in a plurality of sample shots on a wafer substrate warping due to processing are simply averaged.

FIG. 1 schematically shows an example structure of a scanning exposure apparatus according to an embodiment of the present invention. In the figure, reference numeral 101 denotes a light source, for example, an excimer laser or an i-line lamp. Reference numeral 102 denotes an optical element group (two parts) that shapes a beam from the light source 101 and makes it incoherent. The optical element group includes a beam shaping optical system, an optical integrator, a condenser lens, and so forth. A shading plate (masking blade) 103 includes, for example, four (upper, lower, right, and left) plates movable independently of each other. A projection lens 107 projects an image formed by a reticle 105 onto a wafer 111. The reticle 105, being aligned, is placed on a reticle stage 106. The wafer 111 is placed on a wafer stage 110. These stages are driven, being levitated, for example, by an air pad and can be freely driven two-dimensionally. Reference numerals 108 and 109 denote focus sensors used in a focusing operation in which the wafer 111 is brought to a position optically conjugate with the reticle 105. A light projector 108 projects light onto the wafer surface, and the reflected light from the wafer is measured by a detecting element 109. When the surface of the wafer 111 moves in the direction of the optical axis of the exposure light, the image forming position in the detecting element 109 changes vertically in the figure, and the in-focus position can be measured.

[Exemplary Pattern Measurement]

Next, an example method for measuring the pattern unevenness will be described. In order to measure the unevenness of the pattern, the wafer surface (including the pattern) is measured with the focus sensors in advance before exposing the substrate. For the reason of measurement time, a method is used in which the pattern is calculated from the surface shape measurement results limited to several shots. In the method, since there are only the measurement results in the shots selected as sample shots, the local flatness component of the wafer is removed from the measurement results of each shot. In that case, a certain degree of estimation is necessary. For example, if the modes in the surface shape of the wafer are in order from the low order component, the first order component is first removed to obtain the pattern shape in each sample shot, and the measurement results in a plurality of sample shots are averaged to obtain the final pattern offset.

Not only a first order surface (plane) but also a second order approximate surface (paraboloid), a third order approximate surface, and so forth can be used. In the example of FIG. 5, the hyperboloid approximation is more advantageous to faithfully extract the pattern than the plane approximation. If the pattern is planar, the curved surface approximation can deteriorate the reproducibility. What approximate surface is the best depends basically on the state of warping of the wafer surface. Although an operator may input a method for correction, automatic correction is preferable.

Figure 7:
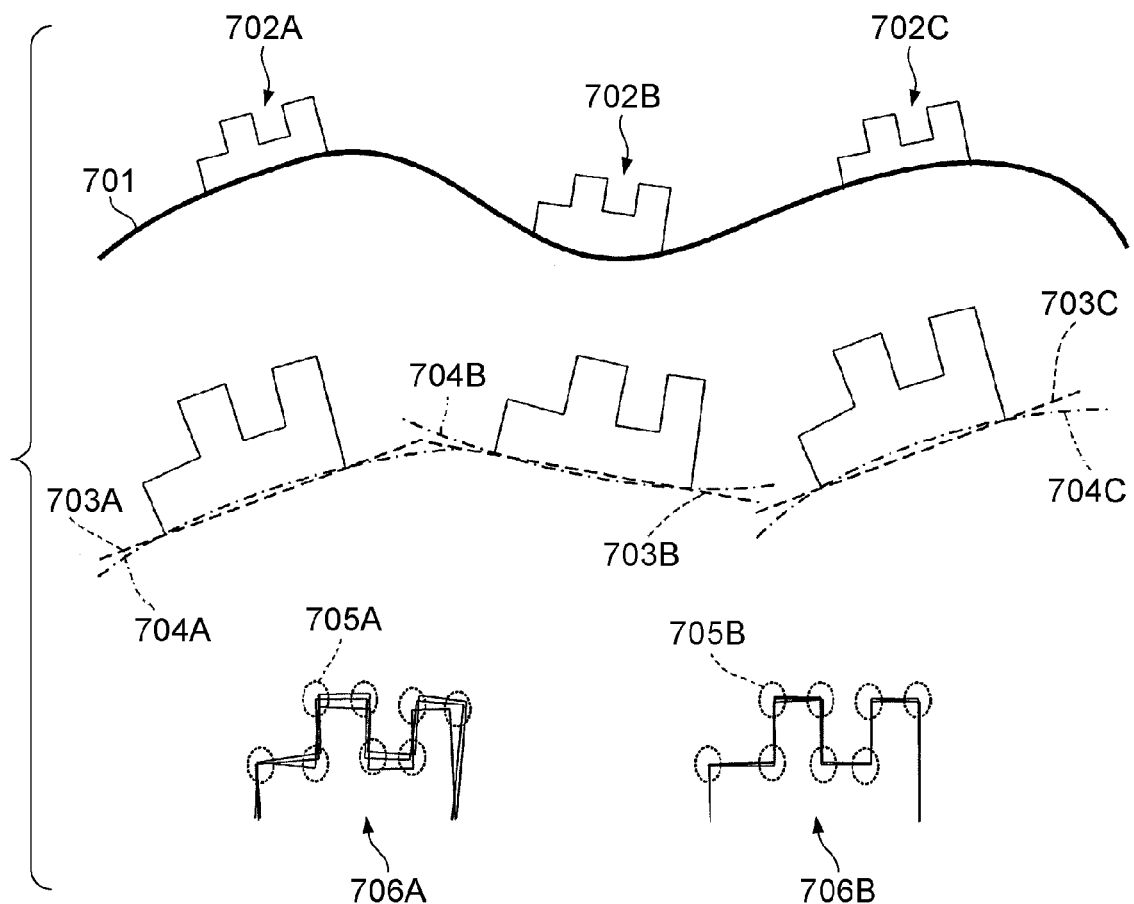
FIG. 7 illustrates how to select a method for removing local components of the wafer.

FIG. 7 illustrates another example method. Patterns 702A to 702C are formed on the wafer substrate 701. There are two methods: a method in which plane components 703A to 703C are calculated from the measurement results of each shot and removed from the measurement results of each shot, and a method in which paraboloids 704A to 704C are calculated and removed. It is more preferable to compare the reproducibility of the corresponding points 705A and 705B of the results 706A and 706B of removing the wafer surface component using the two methods, and determine that the less variable and more reproducible method is an appropriate method for removing. In the case of FIG. 7, 706B is more reproducible, which is the result of removing the wafer surface component using a method in which a paraboloid is calculated and removed.

Figure 8A:
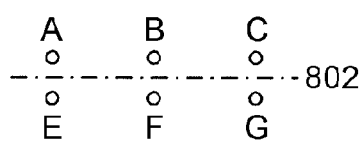
FIGS. 8A and 8B show the arrangement of measurement points on the substrate measured by focus sensors in the scanning exposure apparatus of FIG. 1.
Figure 8B:
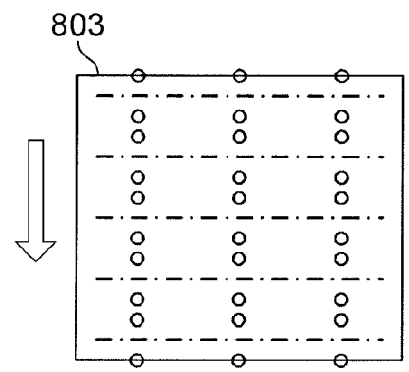

Basically, the pattern offset is calculated by the above-described concept. In the case of measurement using a plurality of focus sensors in a scanning exposure apparatus, the performance can be improved by devising the method for calculating. FIGS. 8A and 8B show an example in a scanning exposure apparatus having a plurality of focus sensors. The focus sensors are arranged in six-channel configuration from A to G. These six channels center on a point 802. In general, this point 802 is specifically the center of the exposure light of the scanning exposure apparatus. The surface of the wafer substrate is measured with these focus sensors during the scanning of the substrate. FIG. 8B shows an example in which a shot 803 is scanned as the six-channel focus sensors measure five points each, 30 points in total. In this embodiment, a method in which a plane is calculated from all of the 30 measurement points on the shot 803, is used as a method for removing the wafer component.

For example, if the time deterioration of the focus sensors or mismeasurement occurs, they are indistinguishable from the wafer component, and therefore one-sided defocusing occurs. In that case, a method is adopted in which no plane is taken in the non-scanning direction. Specifically, the least squares approximation straight line of each of the channels A to G in the scanning direction is calculated, and the inclination average value thereof is used in each of the channels A to G.

This method can also be applied to the case where the tilt variation in the wafer substrate surface differs between the scanning direction and the non-scanning direction due to a special state of the wafer substrate. Therefore, it is possible to use not only the above-described method in which the least squares approximation straight line component in the scanning direction of each channel is calculated but also a method in which the least squares approximation straight line component in the non-scanning direction is calculated, the average inclination amount thereof is calculated, and the component thereof is removed. In addition, since the wafer substrate reproducibility in a particular direction is high at a particular position depending on the state of the wafer substrate, different methods for removing can be used according to the position of the pattern offset sample shot.

Figure 6:
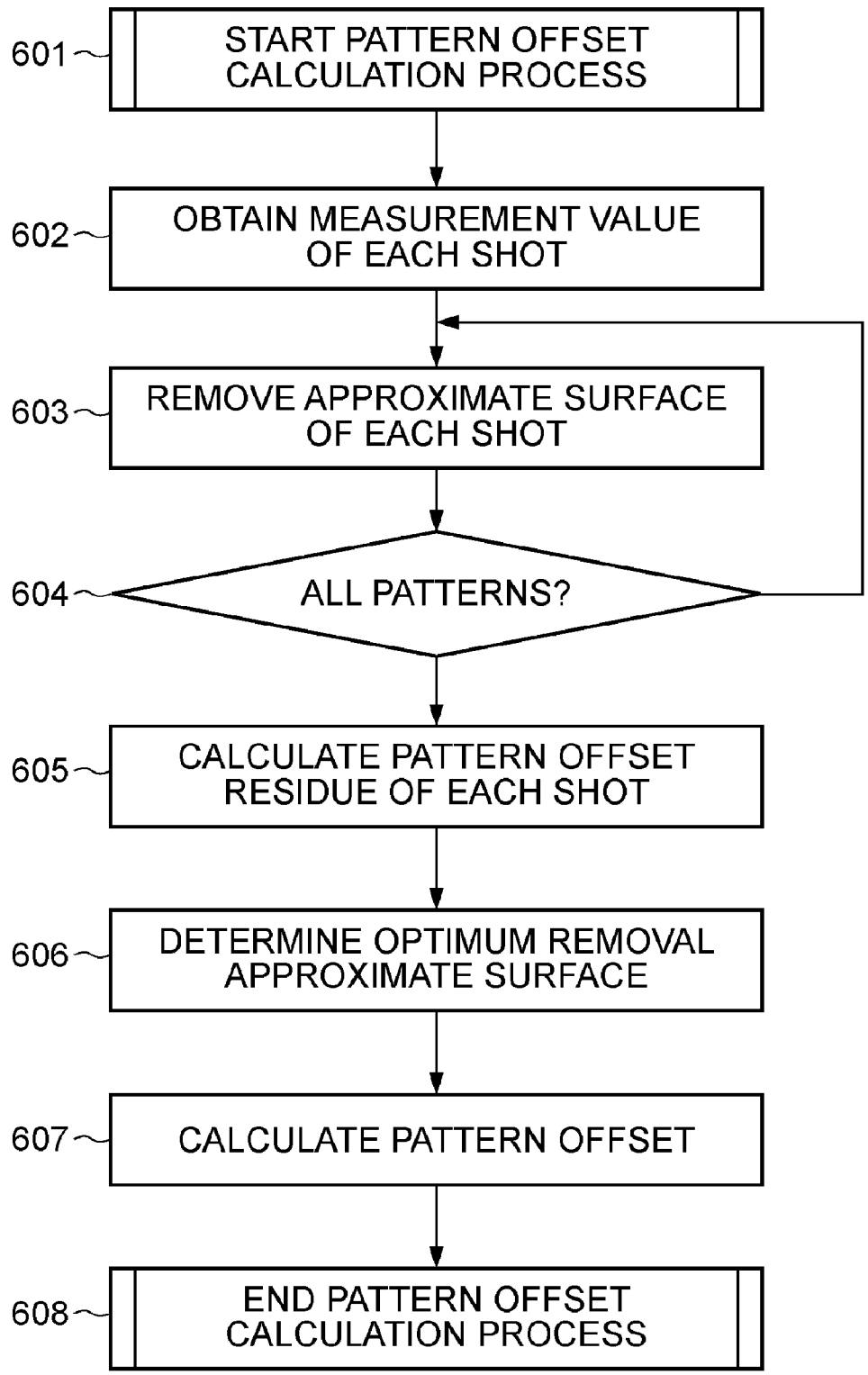
FIG. 6 is a flowchart illustrating the pattern calculating process in the apparatus of FIG. 1.

Next, the flow of pattern calculation will be described with reference to FIG. 6. In step 601, the pattern offset calculation process is started. In step 602, in several shots on the wafer substrate, focus measurement is performed without controlling the focus direction of the stage. In step 603, the approximate surface or the approximate line of each shot is removed. Approximate surfaces include a first order plane, a second order plane, and a third order plane. An approximate line removal can be used in which only one of the non-scanning direction and the scanning direction is removed.

After the method for removing is performed with respect to the patterns of all sample shots (step 604), in step 605, the reproducibility or the range (variation) of the measurement value at each position is calculated. In step 606, the reproducibility or the range at each position of the result of removal using each method is checked, and it is determined that the best or the smallest one is the optimum method for removing. In step 607, using the method determined in step 606, each shot offset value from which the wafer component is removed is averaged, and the pattern offset is determined. In step 608, the process is ended. As a result, the aforementioned embodiment of the present invention can improve the pattern measurement accuracy and therefore can provide an exposure apparatus by which excellent exposure results can be obtained.

[Exemplary Embodiment of Manufacture of Devices]

Figure 9:
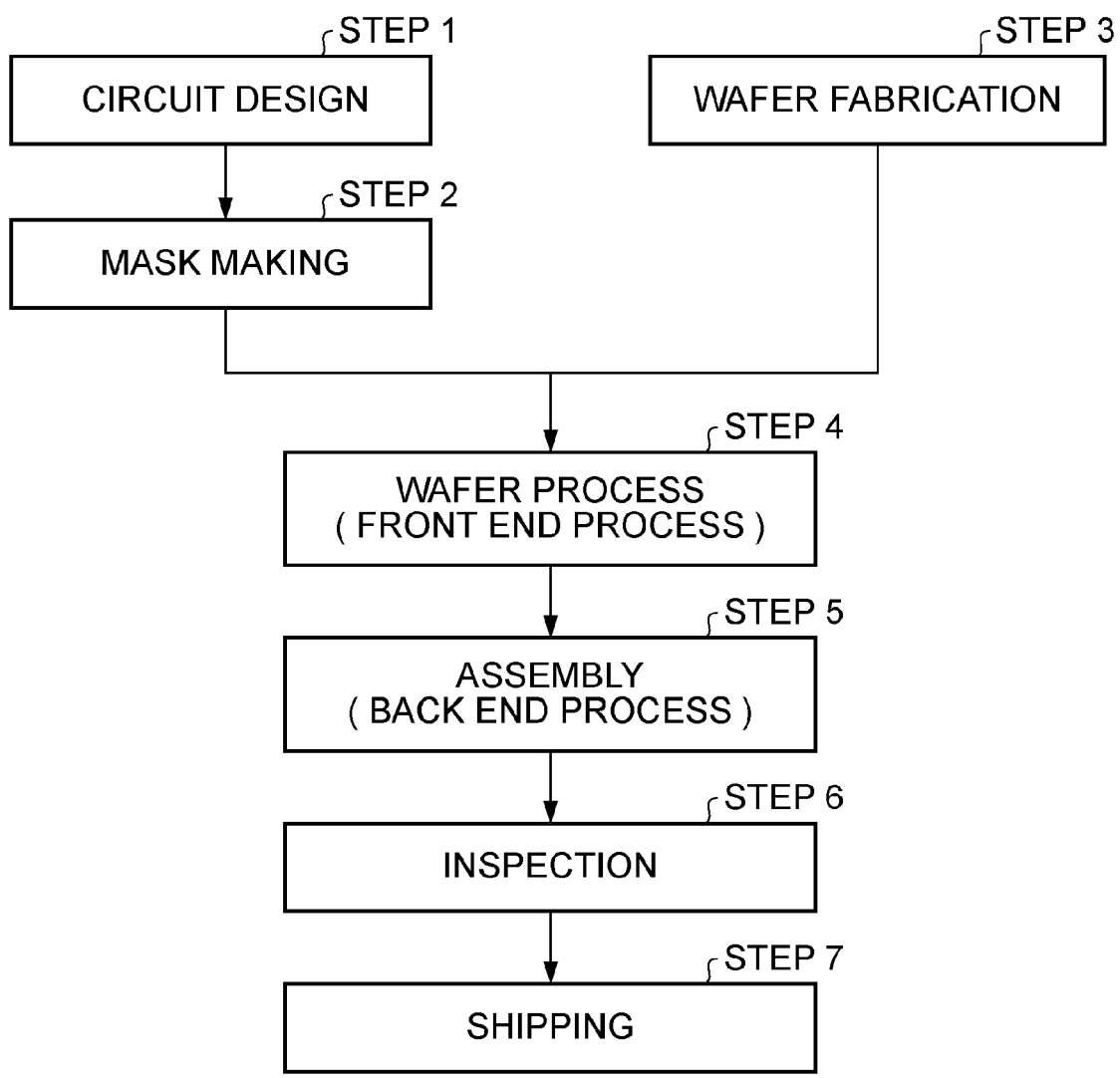
FIG. 9 illustrates the flow of a process for manufacturing devices.

Next, a manufacturing process of minute devices (semiconductor chips such as ICs and LSIs, liquid crystal panels, CCD sensors, thin film magnetic heads, micromachines, and so forth) using the exposure apparatus of FIG. 1 will be described. FIG. 9 shows the flow of manufacture of semiconductor devices. In step 1 (circuit design), a semiconductor device circuit is designed. In step 2 (mask making), a mask (also called a reticle) having the designed pattern is made. In step 3 (wafer fabrication), wafers (also called substrates) are fabricated using a material such as silicon. Step 4 (wafer process) is called a front end process. In step 4, actual circuits are formed on the wafers by lithography using an exposure apparatus in which the mask is placed. Step 5 (assembly) is called a back end process. In step 5, semiconductor chips are made of the wafers processed in step 4. The back end process includes an assembly process (dicing and bonding) and a packaging process (chip encapsulation). In step 6 (inspection), inspections such as an operation confirmation test and a durability test of the semiconductor devices made in step 5 are conducted. Through this process, the semiconductor devices are completed, and shipped in step 7.

The wafer process of step 4 includes the following steps. An oxidation step in which the surface of a wafer is oxidized. A CVD step in which an insulating film is formed on the wafer surface. An electrode formation step in which electrodes are formed on the wafer by vapor deposition. An ion implantation step in which ions are implanted in the wafer. A resist process step in which a photosensitive material is applied to the wafer. An exposure step in which the wafer is exposed through the mask having the circuit pattern using the exposure apparatus. A development step in which the exposed wafer is developed. An etching step in which the wafer is etched except for the developed resist image. A resist stripping step in which the resist is removed. By repeatedly performing these steps, multilayer circuit patterns are formed on the wafer.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2006-245355 filed Sep. 11, 2006, which is hereby incorporated by reference herein in its entirety.

What is claimed is:

1. An exposure apparatus comprising:
   a projection optical system configured to project light from a reticle onto a substrate; and
   a detector configured to detect a position of a surface of the substrate in a direction of the optical axis of the projection optical system,
   wherein the apparatus is configured, while the reticle and the substrate are moved in a scanning direction crossing the optical axis, to detect the position of the surface in a shot on the substrate with the detector, to subtract an offset value determined in advance from the detected position, to move the substrate in the direction of the optical axis based on the subtraction value, and to expose the substrate to light via the reticle and the projection optical system, wherein, with respect to each of a plurality of shots on the substrate, a line or surface is calculated which approximates a plurality of positions of the surface detected by the detector with respect to a plurality of places, and a difference between the position of the surface detected by the detector and the position of the line or surface in the direction of the optical axis is calculated with respect to each of the plurality of places, and wherein with respect to each of the plurality of places, the differences are averaged over the plurality of shots to determine the offset value.

2. An apparatus according to claim 1, wherein the apparatus is configured so that the line or surface is a straight line or plane.

3. An apparatus according to claim 1, wherein the apparatus is configured so that the line or surface is a curved line or curved surface.

4. An apparatus according to claim 1, wherein the apparatus is configured so that a kind of the line or surface is selected from a plurality of kinds of the line or surface.

5. An apparatus according to claim 1, wherein the apparatus is configured so that the line or surface is expressed by a function of a position coordinate in a surface perpendicular to the optical axis.

6. An apparatus according to claim 5, wherein the apparatus is configured so that degree of the function is not greater than 3.

7. An apparatus according to claim 4, wherein the apparatus is configured so that reproducibility of the differences over the plurality of shots is calculated with respect to each of the plurality of kinds, and the differences of which reproducibility is most reproducible are averaged to determine the offset value.

8. An apparatus according to claim 1, wherein the apparatus is configured so that a kind of the line or surface is selected from a plurality of kinds of the line or surface with respect to each of the plurality of shots.

9. A method of manufacturing a device using an exposure apparatus including, a projection optical system configured to project light from a reticle onto a substrate; and a detector configured to detect a position of a surface of the substrate in a direction of the optical axis of the projection optical system, wherein the apparatus is configured, while the reticle and the substrate are moved in a scanning direction crossing the optical axis, to detect the position of the surface in a shot on the substrate with the detector, to subtract an offset value determined in advance from the detected position, to move the substrate in the direction of the optical axis based on the subtraction value, and to expose the substrate to light via the reticle and the projection optical system, wherein, with respect to each of a plurality of shots on the substrate, a line or surface is calculated which approximates a plurality of positions of the surface detected by the detector with respect to a plurality of places, and a difference between the position of the surface detected by the detector and the position of the line or surface in the direction of the optical axis is calculated with respect to each of the plurality of places, and wherein with respect to each of the plurality of places, the differences are averaged over the plurality of shots to determine the offset value;

the method comprising:

exposing a substrate to light using the exposure apparatus;

developing the exposed substrate; and processing the developed substrate to manufacture the device.

* * * * *